(12) United States Patent
Baturin et al.

(10) Patent No.: US 7,710,112 B2
(45) Date of Patent: May 4, 2010

(54) REED RELAY FOR MAGNETIC FIELD MEASUREMENT

(75) Inventors: Nikolay Baturin, Sugar Land, TX (US); Alexander J. Esin, Cedar Park, TX (US); Alex Kulik, Sugar Land, TX (US); Michael Masterov, Houston, TX (US)

(73) Assignee: Thermo Fisher Scientific Inc., Sugar Land, TX (US)

( * ) Notice: Subject to any disclaimer, the term of this patent is extended or adjusted under 35 U.S.C. 154(b) by 313 days.

(21) Appl. No.: 11/849,076

(22) Filed: Aug. 31, 2007

(65) Prior Publication Data

US 2009/0058410 A1  Mar. 5, 2009

(51) Int. Cl.
*G01R 33/02* (2006.01)
(52) U.S. Cl. ........................... 324/244; 324/262
(58) Field of Classification Search ............ 324/207.13, 324/207.24, 207.25, 207.26, 244, 259, 260
See application file for complete search history.

(56) References Cited

U.S. PATENT DOCUMENTS

| | | | | |
|---|---|---|---|---|
| 3,321,702 A | * | 5/1967 | Tuccinardi | 324/259 |
| 3,349,323 A | * | 10/1967 | Mullen | 324/259 |
| 3,665,511 A | * | 5/1972 | Wolf | 340/540 |
| 3,801,908 A | * | 4/1974 | Van Andel | 324/117 R |
| 4,232,265 A | * | 11/1980 | Smirnov | 324/260 |

* cited by examiner

*Primary Examiner*—Kenneth J Whittington
(74) *Attorney, Agent, or Firm*—Osha • Liang LLP

(57) ABSTRACT

An apparatus for measuring a strength of a magnetic field, including a switch including contacts configured to change position when a switching threshold is reached, wherein the switching threshold is reached by modifying an external magnetic field around the switch, and a coil wound around the switch, wherein the coil is used to modify the external magnetic field, wherein a first current is driven through the coil wound around the switch until a first switching threshold is obtained, wherein a second current is driven through the coil wound around the switch until a second switching threshold is obtained, and wherein a value of the first current when the first switching threshold is reached and a value of the second current when the second switching threshold is reached are used to determine the strength of the magnetic field.

30 Claims, 4 Drawing Sheets

REED RELAY FOR MAGNETIC FIELD MEASUREMENT

BACKGROUND

Typically, magnetic fields are measured using flux gates or Hall probes (i.e., Hall effect switches). A Hall effect refers to the potential difference on the opposite sides of an electrical semiconductor through which an electrical current is flowing, created by a magnetic field applied perpendicular to the current. The applied magnetic field exerts a transverse force on the moving charge carriers in the flowing current, which tends to push the charge carrier to one side of the semiconductor. A buildup of charge at the sides of the semiconductor balances this magnetic influence, producing a measurable voltage between the two sides of the semiconductor. A measurement of the voltage created by the Hall effect can be used to obtain a measurement of the magnetic field. Because Hall probes use semiconductors to measure a magnetic field, the Hall effect method is subject to all the common limitations associated with semiconductors, such as sensitivity to temperature and changes over time to the semiconductor material. Further, Hall effect devices typically produce a very low signal level and thus require amplification.

Alternatively, changes in magnetic field strength can be measured using flux gates. A flux gate is made by winding coil around a core of an electromagnet (several turns of electric wire). In accordance with Faraday's Law, any change in the magnetic environment of a coil of wire will cause a voltage to be "induced" in the coil. Therefore, any changes of magnetic flux through the electromagnet core produce voltage on the flux gate, and the induced voltage is directly proportional to the time derivative of magnetic flux and the number of wire turns of the flux gate. Flux gates used to measure the strength of magnetic fields can be very sensitive to quick changes of magnetic field, and may also have a weak sensitivity to slow changes of magnetic field. Moreover, the flux gate measurement device must be periodically recalibrated with respect to a well-known magnetic field.

SUMMARY

In general, in one aspect, the invention relates to an apparatus for measuring a strength of a magnetic field, comprising a switch comprising contacts configured to change position when a switching threshold is reached, wherein the switching threshold is reached by modifying an external magnetic field around the switch, and a coil wound around the switch, wherein the coil is used to modify the external magnetic field, wherein a first current is driven through the coil wound around the switch until a first switching threshold is obtained, wherein a second current is driven through the coil wound around the switch until a second switching threshold is obtained, and wherein a value of the first current when the first switching threshold is reached and a value of the second current when the second switching threshold is reached are used to determine the strength of the magnetic field.

In general, in one aspect, the invention relates to a method for measuring a strength of a magnetic field, comprising applying a first current through a coil wound around a switch until a first switching threshold is reached, measuring the first current to obtain a first current value after the first switching threshold is reached, erasing a magnetic memory of the switch, applying a second current through the coil until a second switching threshold is reached, measuring the second current to obtain a second current value after the second switching threshold is reached, and calculating the strength of the magnetic field using the first current value and the second current value.

In general, in one aspect, the invention relates to a method for measuring a concentrated magnetic field, comprising applying a first current through a coil wound around a switch until a first switching threshold is reached, measuring the first current to obtain a first current value after the first switching threshold is reached, erasing a magnetic memory of the switch, applying a second current through the coil until a second switching threshold is reached, measuring the second current to obtain a second current value after the second switching threshold is reached, calculating a value of a fringe magnetic field using the first current value and the second current value, and calculating a value of the concentrated magnetic field using the value of the fringe magnetic field.

In general in one aspect, the invention relates to a method for measuring a strength of a magnetic field using a reed relay.

In general, in one aspect, the invention relates to an apparatus for measuring a strength of a magnetic field, comprising a reed relay configured to measure the strength of the magnetic field.

Other aspects of the invention will be apparent from the following description and the appended claims.

DETAILED DESCRIPTION

Figure 1:
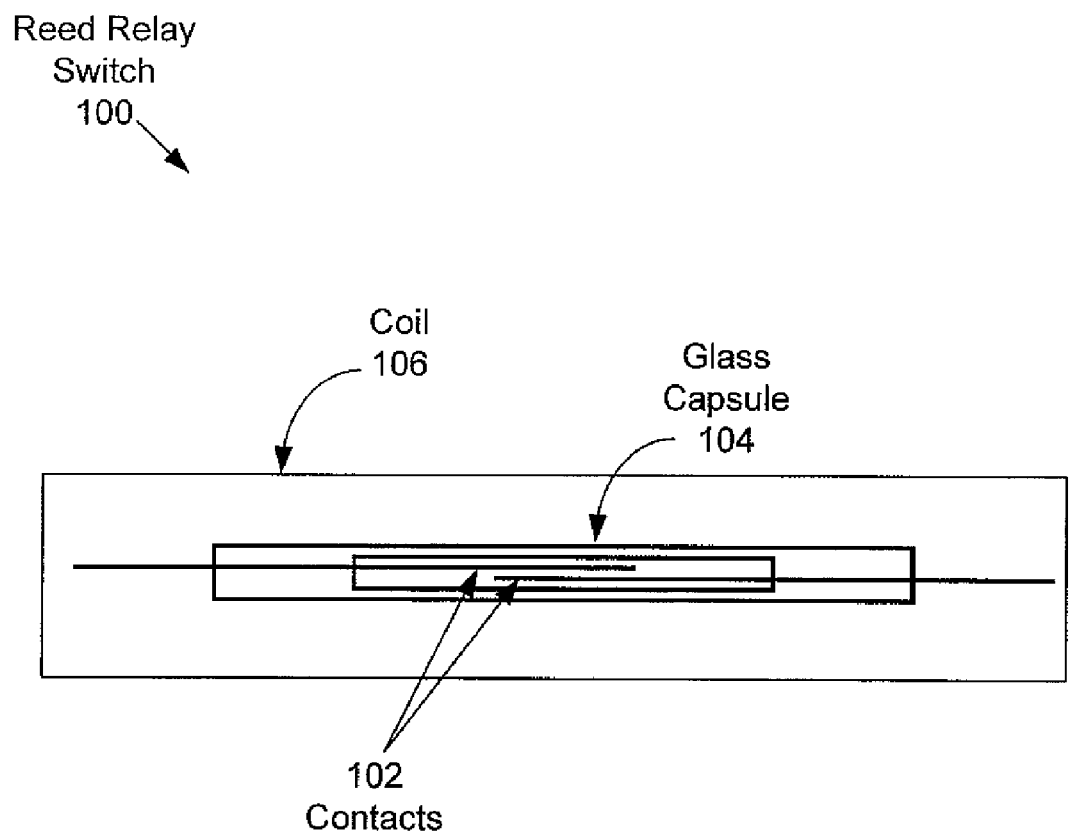
FIG. 1 shows a reed relay in accordance with one or more embodiments of the invention.

Specific embodiments of the invention will now be described in detail with reference to the accompanying figures. Like elements in the various figures are denoted by like reference numerals for consistency.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

In general, embodiments of the invention provide an apparatus and a method for measuring the strength of a magnetic field. Specifically, one or more embodiments of the invention provide for using a switch that responds to the presence of an external magnetic field for measuring a strength of the magnetic field.

An example of a device or apparatus used to measure the strength of a magnetic field is shown in FIG. 1. More specifically, in one or more embodiments of the invention, the device shown in FIG. 1 is a reed relay (100). A reed relay includes a reed switch (108). A reed switch (108) is an electrical switch that operates by an applied magnetic field. A reed switch (108) includes a pair of contacts (102) on two magnetizable, electrically conductive, ferrous metal reeds in a hermetically sealed glass envelope (i.e., a glass capsule (104)). The reeds are hermetically sealed into the glass capsule (104) such that the ends align and overlap, but with a small gap in between the ends. The contacts (102) may be normally open, closing when a certain level of a magnetic field is reached, or normally closed and opening when the level of magnetic field is reached. Those skilled in the art will appreciate that the contacts of the reed switch (108) are typically open in an off position, and the reed switch changes to an "on" position by closing the contacts when a magnetic field is present. Those of ordinary skill in the art will appreciate that other magnetizable, electrically conductive materials may be used.

Further, a reed relay (100) is a type of relay in which the reed switch (108) is mounted inside a coil (106) such that the coil (106) and the reed switch (108) are operatively connected. The coil (106) is selected based on the maximum strength of the magnetic field to be applied via the coil (106). More specifically, in one or more embodiments of the invention, the coil (106) is of a size that can generate a magnetic field slightly more than the maximum strength of the magnetic field to be applied.

Those skilled in the art will appreciate that while FIG. 1 discusses a reed relay as the type of switch used to measure the strength magnetic field, embodiments of the invention may be practiced using any switch that acts as a threshold detector of a magnetic field value (i.e., a switch that responds to a change in the magnetic field beyond a threshold magnetic field value). Said another way, the present invention applies to any switch that may include contacts that change position in response to a change in the strength of an external magnetic field, where the threshold level of the switch may be controlled by a user or other entity.

In one or more embodiments of the invention, the reed relay is used to measure the strength of an external magnetic field present in the surrounding area of the reed relay. For a given reed relay, the switching threshold of the reed switch is fixed, depending on the construction of the reed switch. By driving current through the coil of the reed relay, the magnetic field experienced by the reed relay may be reinforced or countered, depending on which direction the current is driven through the coil. Thus, for the same external magnetic field, by applying an additional positive or negative magnetic field through the coil, the switching threshold of the reed relay can be reached. More specifically, the strength and the direction of the additional magnetic field can be user-controlled by driving an appropriate amount of current through the coil of the reed relay.

In one or more embodiments of the invention, when the switching threshold has been reached, the a reed relay changes from an "off" to an "on" position (or vice versa). More specifically, a switching threshold is reached when a certain measure (i.e., strength) of a magnetic field is present and the switch within the reed relay reacts to the magnetic field by changing positions. In one or more embodiments of the invention, the magnetic field in the coil is the sum of the external magnetic field and the magnetic field created by the coil, plus or minus a small amount. For example, the magnetic field inside the coil may be +/−10 Gauss. To obtain a switching threshold and change the switch position from off to on, for example, the current applied through the coil changes the magnetic field inside the coil by an amount that triggers the switch to change positions. For example, the current applied through the coil may change the magnetic field by 5 or 6 Gauss to obtain the switching threshold.

Figure 2:
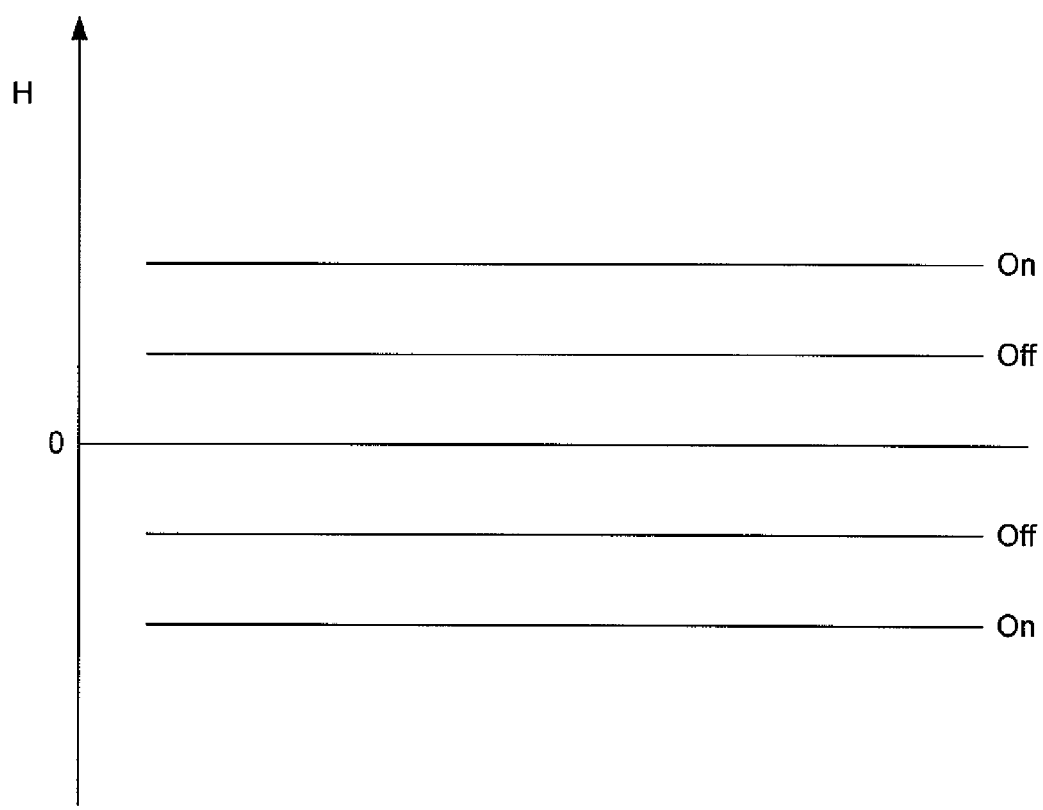
FIGS. 2-3 show graphs in accordance with one or more embodiments of the invention.

Further, reed relays work the same way in a positive and negative magnetic field. Thus, in one or more embodiments of the invention, there are two "on" switching thresholds (e.g., when the contacts of the reed relay close). Similarly, there are two "off" switching thresholds (e.g., when the contacts of the reed relay open). These four switching thresholds are depicted schematically in FIG. 2. FIG. 2 shows a graph of the on and off positions of the reed relay in accordance with one or more embodiments of the invention. The graph shown in FIG. 2 centers around a magnetic field (H) of zero. This is because in the absence of an external magnetic field, the switching thresholds are symmetrical with respect to zero. However, those skilled in the art will appreciate that because a magnetic field is always present in any surrounding, the graph of the switching thresholds may shift upward or downward depending on the external magnetic field polarity. Thus, the switching thresholds shown in FIG. 2 may center around a positive or negative external magnetic field strength.

Figure 3:
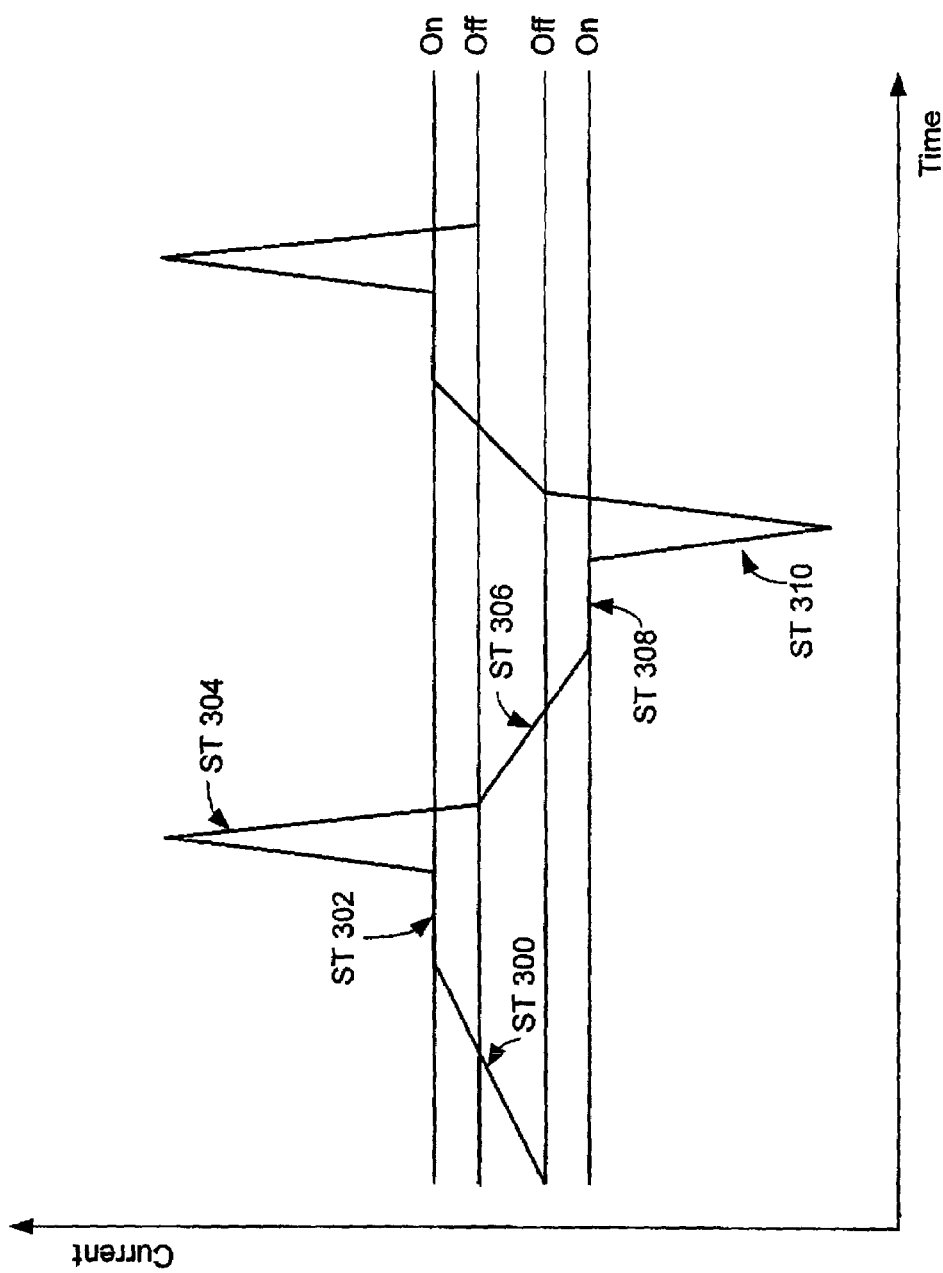

The time diagram of the current through the coil is depicted in the graph of FIG. 3 in accordance with one or more embodiments of the invention. Specifically, in one or more embodiments of the invention, FIG. 3 shows the various currents driven through the coil until switching thresholds are reached. The currents driven through the coil are then used to obtain a measurement of the external magnetic field.

Initially, a current is increased from a value of zero through the coil until the magnetic field inside the coil is modified sufficiently to close the switch (i.e., until the "on" switching threshold is reached) (ST 300). Once the change of the switch state is detected, the current stays level (ST 302), and a current measurement is obtained at this point in time. Those skilled in the art will appreciate that it does not matter whether the switch is initially on or off. If the switch is initially "on" (i.e., closed), then current can be increased until the switch changes from on to off and then from off to on again. Alternatively, if the switch is initially "off", then the current value can be measured when the switch turns "on" and the contacts close.

Next, a current pulse is applied (ST 304). In one or more embodiments of the invention, the current pulse is applied after the first switching threshold is reached (e.g., when the switch is "on"). The current pulse is applied to overcome the magnetic hysteresis of the reed relay. More specifically, the metal in the switch (i.e., the reeds on which the contacts are located) is made out of magnetic material. Therefore, the reeds are magnetized when the external magnetic field reaches a certain threshold level, and the magnetization of the reeds carries memory of the previous history. This effect makes the switching threshold dependent on history, thus introducing a source of error. Anti-hysteresis pulses are applied to destroy the switch memory. Said another way, the anti-hysteresis pulses of current are used to erase the memory of the external magnetic field. The magnetic field generated by AHPs is so strong that the variations of the field effected to the reed switch prior to the AHP have no effect on the switching threshold after the AHP is applied. Those skilled in the art will appreciate that exposure to the high magnetic field caused by the anti-hysteresis pulse of current through the coil is strong enough to destroy the magnetic memory of the switch, even if the pulse does not drive the reeds into magnetic saturation.

Further, those skilled in the art will appreciate that other methods for erasing the reed switch memory may also be employed in the present invention. For example, the switch may be demagnetized by applying a decaying sinusoidal waveform of current through the coil of the reed relay, i.e., a demagnetization current. Another possible way to demagnetize a reed switch is to apply an additional external periodic magnetic field with time oscillating and decreasing to zero strength.

Continuing with the graph shown in FIG. 3, after the AHP is applied, current is decreased in the coil and at some point in time the switch reaches the "off" threshold and opens (ST 306). Current continues to be applied until the "on" threshold is obtained in the opposite direction. After the switch reaches the second "on" threshold and closes, the current stays level for measurement (ST 308). Subsequently, a negative pulse of current is applied (ST 310). The negative pulse is applied by driving current through the coil of the reed relay in the opposite direction. Finally, STs 300-310 may be repeated to obtain more accurate or further current measurements for calculation of the strength of the magnetic field.

The current measurements obtained from the process described with respect to FIG. 3 are used to calculate the strength of the external magnetic field, using the following formula:

$$H+H_c=H_s,$$

where H is the external magnetic field to be measured, $H_c$ is the compensating field (either positive or negative) generated inside the coil and $H_s$ is the switching threshold magnetic field. At the time that the switching threshold is reached, the value of the magnetic field is known because $H_s$ is a fixed value that is dependent on the construction of the switch. $H_c$ is the value calculated as a function of the current and the number of turns and size of the coil used in the reed relay. In one or more embodiments of the invention, the average of the two current values obtained in FIG. 3 is used as the single current value used to calculate $H_c$.

In one or more embodiments of the invention, the magnetic field measurement obtained from the process described above may be displayed on a display device (e.g., a computer screen, a mobile device, a electronic compass, or other display device) for informative purposes, or may be used in other calculations in the fields of mathematics, physics, geophysics/geoscience, environmental sciences, and other related sciences. For example, engineers, scientists, etc., may measure magnetic fields to compute the earth's magnetic field (or other planetary magnetic fields) for environmental and atmospheric purposes, to compute a magnetic field in a wellbore for standard drilling control methods, to compute fluid flow in a pipe that is dependent on the magnetic field generated in the pipe, to detect a magnetic ore, for use as an electromagnetic compass, for medical purposes such as cardiac pacing, or for any other purpose for which a magnetic field measurement may be useful.

In one or more embodiments of the invention, a reed relay may be used to measure various types of magnetic fields. For example, in one or more embodiments of the invention, in addition to being used for measuring an external magnetic field (i.e., a naturally occurring magnetic field), a reed relay may be used to measure the strength of a concentrated magnetic field. A concentrated magnetic field is a magnetic field generated between the poles of an electromagnet. Often times, the concentrated magnetic field cannot be measured directly where the field is generated. For example, a material may be treated using a concentrated magnetic field, in which case portions of the material may need to be displaced if the concentrated magnetic field is measured directly. More commonly, when a measurement is made directly inside the concentrated magnetic field, the field is disturbed, which may not be desirable in order to obtain an accurate measurement of the concentrated magnetic field. Alternatively, there may be limited access to the concentrated magnetic field area.

Figure 4:
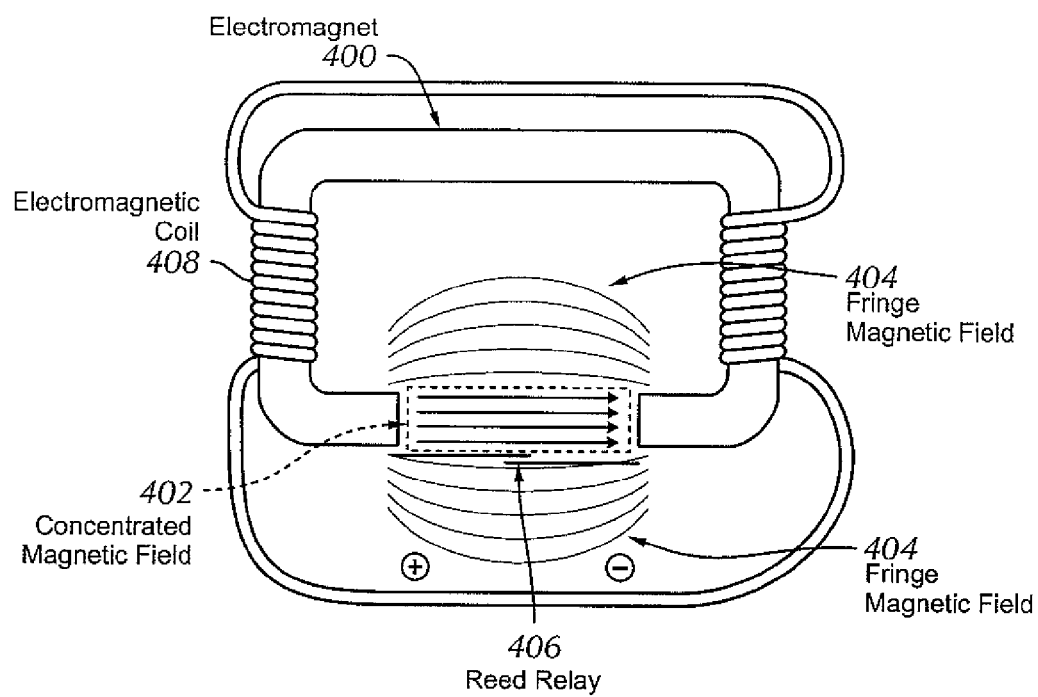
FIG. 4 shows a reed relay for measuring a concentrated magnetic field in accordance with one or more embodiments of the invention.

Therefore, in one or more embodiments of the invention, a reed relay may be used to obtain a measurement of the concentrated magnetic field without directly measuring the concentrated magnetic field. FIG. 4 shows an electromagnet (400) that is associated with a concentrated magnetic field (402) and a fringe magnetic field (404) in accordance with one or more embodiments of the invention. Further, FIG. 4 shows a reed relay (406). In one or more embodiments of the invention, the reed relay (406) is a reed relay similar to that shown in FIG. 1 above. Each of the aforementioned components of FIG. 4 are described in detail below.

The concentrated field (402) is the field between the electromagnet poles. In FIG. 4, the concentrated magnetic field (402) is the field in between the two poles of the electromagnet (400). Those skilled in the art will appreciate that in the absence of the yoke (e.g., magnetic material, like iron, nickel, permalloy, etc.), the concentrated field strength would be perfectly computable as a function of the current driven through the magnet coil (408) (i.e., the coil wound around the electromagnet (400)) and the magnet coil geometry. However, due to the presence of the magnetic yoke, the main field is also a function of the yoke magnetic permeability. Those skilled in the art will further appreciate that the yoke magnetic permeability changes with temperature and previous magnetization history, thus often making the exact value of the magnetic field difficult to calculate.

Returning to FIG. 4, in one or more embodiments of the invention, in addition to affecting the concentrated magnetic field (402), the magnetic permeability of the electromagnet (400) also affects the fringe magnetic field (404). The fringe magnetic field (404) is the magnetic field present in the surrounding area of the concentrated magnetic field (402) and around the electromagnet (400). In one or more embodiments of the invention, the current driven through the electromagnet coil (408), and a measurement of the fringe magnetic field (404) obtained from the current threshold values exhibited by reed relay coil, are used to compute the concentrated magnetic field (402). As the distance from the concentrated magnetic field (402) grows, the fringe magnetic field (404) becomes weaker. Thus, in one or more embodiments of the invention, the reed relay (406) is placed as close to the concentrated magnetic field (402) as possible, without disturbing the concentrated magnetic field (402).

Those skilled in the art will appreciate that both the concentrated magnetic field and the fringe magnetic field are a function of the electromagnet design (a value that is fixed), the current in the electromagnet coil (408), and the magnetic permeability of the electromagnet core. This relationship is depicted below as:

$$H=f\{H_{d,I,G}\},$$

where H represents the concentrated magnetic field, $H_d$ represents the fringe magnetic field, I represents the current in the coil, and G represents a vector of the geometry of the electromagnet. Therefore, by measuring the value of the current driven through the coil and the fringe magnetic field, the concentrated magnetic field strength can be calculated. By calculating the concentrated magnetic field in this manner, the magnetic permeability of the electromagnet, which affects the calculation of the fringe magnetic field, is also effectively measured. In one or more embodiments of the invention, the fringe magnetic field may be measured using a reed relay and the process described above in FIG. 3. Alternatively, the fringe magnetic field may be measured using flux gates, a Hall effect probe, or any other known method for measuring magnetic fields.

Further, those skilled in the art will appreciate that while FIG. 4 shows a single reed relay, the present invention may be practiced using several reed relays. For example, several reed relays can be used to increase the reliability and robustness of the measurement system by using the multi-relay system to increase redundancy and fault-detection capabilities. Moreover, multiple reed relays may be tuned for differing ranges of the magnetic field to be measured, permitting a faster or more accurate measurement to be obtained.

Embodiments of the invention provide an apparatus for measuring magnetic fields. Specifically, embodiments of the invention provide an atypical way to use a common logical switch, e.g., a reed relay, to measure a magnetic field. Using embodiments of the present invention, a measurement of the strength of a magnetic field may be obtained with time stability and temperature stability. More specifically, even if the switching thresholds drift due to temperature, aging, or for other reasons, the thresholds drift symmetrically for positive and negative magnetic fields. Such drift is canceled out in the average of two switching thresholds. Similarly, replacing the switch does not affect the measurement. In addition, embodiments of the invention provide an apparatus and method for measuring a concentrated magnetic field without disturbing the concentrated magnetic field by direct measurement.

Further, the error of measurement of the strength of the magnetic field measured using embodiments of the present invention is fixed. That is, the measurement of the magnetic field is as precise as the measurement of the current driven through the reed relay coil, and the magnetic field generated by the reed relay coil when current is driven through the coil of the reed relay is directly related to the size of the coil used in the reed relay. Thus, using embodiments of the present invention, a large magnetic field may be measured to the same tolerance as measuring a very small magnetic field.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An apparatus for measuring a strength of a magnetic field, comprising:
   a switch comprising contacts configured to change position when a switching threshold is reached, wherein the switching threshold is reached by modifying an external magnetic field around the switch; and
   a coil wound around the switch, wherein the coil is used to modify the external magnetic field,
   wherein a first current is driven through the coil wound around the switch until a first switching threshold is obtained,
   wherein a second current is driven through the coil wound around the switch until a second switching threshold is obtained, and
   wherein a value of the first current when the first switching threshold is reached and a value of the second current when the second switching threshold is reached are used to determine the strength of the magnetic field.

2. The apparatus of claim 1, wherein a magnetic memory associated with the switch is erased after the first switching threshold is reached.

3. The apparatus of claim 2, wherein the magnetic memory is erased by applying a anti-hysteresis pulse of current through the coil to saturate the switch.

4. The apparatus of claim 2, wherein the magnetic memory is erased by applying a decaying sinusoidal waveform of current through the coil to demagnetize the switch.

5. The apparatus of claim 1, wherein the external magnetic field is computed by taking the average of the first current value and the second current value.

6. The apparatus of claim 1, wherein the second current is driven through the coil in the opposite direction of the first current.

7. The apparatus of claim 1, wherein the switch is a reed switch.

8. The apparatus of claim 1, wherein the apparatus is a reed relay.

9. The apparatus of claim 1, wherein the first switching threshold is reached when the contacts of the switch change from an open position to a closed position.

10. The apparatus of claim 1, wherein the magnetic field measured is a naturally occurring magnetic field present in the surrounding area of the switch.

11. The apparatus of claim 1, wherein the magnetic field measured is a fringe magnetic field, and wherein the fringe magnetic field is used to compute a concentrated magnetic field.

12. The apparatus of claim 1, wherein the strength of the magnetic field is obtained using an average of the first current value and the second current value.

13. A method for measuring a strength of a magnetic field, comprising:
    applying a first current through a coil wound around a switch until a first switching threshold is reached;
    measuring the first current to obtain a first current value after the first switching threshold is reached;
    erasing a magnetic memory of the switch;
    applying a second current through the coil until a second switching threshold is reached;
    measuring the second current to obtain a second current value after the second switching threshold is reached; and
    calculating the strength of the magnetic field using the first current value and the second current value.

14. The method of claim 13, wherein applying a first current through the coil counters an external magnetic field, resulting in the switch reaching the first switching threshold.

15. The method of claim 13, wherein the strength of the magnetic field is obtained using an average of the first current value and the second current value.

16. The method of claim 13, wherein the magnetic memory of the switch is erased after the first switching threshold is obtained.

17. The method of claim 13, wherein erasing the magnetic memory of the switch comprises:
    applying an anti-hysteresis pulse of current through the coil.

18. The method of claim 13, wherein erasing the magnetic memory of the switch comprises:
    applying a decaying sinusoidal waveform of current through the coil to demagnetize the switch.

19. The method of claim 13, wherein the second current is driven through the coil in the opposite direction of the first current.

20. The method of claim 13, wherein the switch is a reed switch.

21. The method of claim 20, wherein the coil wound around the reed switch forms a reed relay.

22. The method of claim 13, wherein the first switching threshold is reached when contacts within the switch change from an open position to a closed position as a result of an external magnetic field modified by driving the first current through the coil.

23. The method of claim 13, wherein the magnetic field measured is one selected from a group consisting of a planetary magnetic field and a magnetic field caused by a presence of a electromagnet near the switch.

24. The method of claim 13, wherein the magnetic field measured is a fringe magnetic field, and wherein a value of the fringe magnetic field is used to compute a value of a concentrated magnetic field.

25. The method of claim 13, further comprising:
   displaying the strength of the magnetic field on a display device.

26. A method for measuring a concentrated magnetic field, comprising:
   applying a first current through a coil wound around a switch until a first switching threshold is reached;
   measuring the first current to obtain a first current value after the first switching threshold is reached;
   erasing a magnetic memory of the switch;
   applying a second current through the coil until a second switching threshold is reached;
   measuring the second current to obtain a second current value after the second switching threshold is reached;
   calculating a value of a fringe magnetic field using the first current value and the second current value; and
   calculating a value of the concentrated magnetic field using the value of the fringe magnetic field.

27. The method of claim 26, wherein erasing a magnetic memory of the switch comprises:
   applying an anti-hysteresis pulse of current through the coil.

28. The method of claim 26, wherein erasing a magnetic memory of the switch comprises:
   applying a decaying sinusoidal waveform of current through the coil to demagnetize the switch.

29. A method for measuring a strength of a magnetic field using a reed relay, wherein using the reed relay comprises:
   applying a first current through the reed relay until a first switching threshold is reached;
   measuring the first current to obtain a first current value after the first switching threshold is reached;
   erasing a magnetic memory of the reed relay;
   applying a second current through the reed relay until a second switching threshold is reached;
   measuring the second current to obtain a second current value after the second switching threshold is reached; and
   calculating the strength of the magnetic field using the first current value and the second current value.

30. An apparatus for measuring a strength of a magnetic field, comprising:
   a reed relay configured to measure the strength of the magnetic field,
   wherein measuring the strength of the magnetic field using the reed relay comprises:
      applying a first current through the reed relay until a first switching threshold is reached;
   measuring the first current to obtain a first current value after the first switching threshold is reached;
   erasing a magnetic memory of the reed relay;
   applying a second current through the reed relay until a second switching threshold is reached;
   measuring the second current to obtain a second current value after the second switching threshold is reached; and
   calculating the strength of the magnetic field using the first current value and the second current value.

\* \* \* \* \*